United States Patent
Gates et al.

(10) Patent No.: US 9,219,037 B2
(45) Date of Patent: Dec. 22, 2015

(54) LOW K POROUS SICOH DIELECTRIC AND INTEGRATION WITH POST FILM FORMATION TREATMENT

(75) Inventors: Stephen M. Gates, Ossining, NY (US); Alfred Grill, White Plains, NY (US); Son Nguyen, Yorktown Heights, NY (US); Satyanarayana V. Nitta, Poughquag, NY (US); Thomas M. Shaw, Peekskill, NY (US)

(73) Assignee: GLOBALFOUNDRIES INC., Grand Cayman (IL)

( * ) Notice: Subject to any disclaimer, the term of this patent is extended or adjusted under 35 U.S.C. 154(b) by 0 days.

(21) Appl. No.: 13/603,008

(22) Filed: Sep. 4, 2012

(65) Prior Publication Data

US 2012/0329287 A1    Dec. 27, 2012

Related U.S. Application Data

(62) Division of application No. 11/846,250, filed on Aug. 28, 2007.

(51) Int. Cl.
*B05D 3/06* (2006.01)
*B05D 3/14* (2006.01)
(Continued)

(52) U.S. Cl.
CPC .......... *H01L 23/5329* (2013.01); *C23C 16/401* (2013.01); *C23C 16/505* (2013.01); *C23C 16/56* (2013.01); *H01L 21/0234* (2013.01);
(Continued)

(58) Field of Classification Search
CPC ............. C23C 16/325; C23C 16/401–16/402; C23C 16/56; C23C 16/50–16/517; H01J 2237/336; H01J 2237/338; H01J 2237/3321
USPC ......... 427/489, 491, 503, 497, 498, 509, 512, 427/515, 533–545, 551–555, 557–559, 563, 427/567, 568, 574, 575, 578, 579; 438/759, 438/781, 783, 784, 787, 788, 789, 790
See application file for complete search history.

(56) References Cited

U.S. PATENT DOCUMENTS 4,668,652 A    5/1987  Fumagalli et al.
5,384,156 A    1/1995  Belt et al.
(Continued)

OTHER PUBLICATIONS

Lewis Sr., R. J., editor; "Hawley's Condensed Chemical Dictionary", 12th edition; Van Nostrand Reinhold company, New York; 1993 (no month), excerpt pp. 104-105 & 791-792.
(Continued)

*Primary Examiner* — Marianne L Padgett
(74) *Attorney, Agent, or Firm* — Scully, Scott, Murphy & Presser, P.C.

(57) ABSTRACT

A porous SiCOH dielectric film in which the stress change caused by increased tetrahedral strain is minimized by post treatment in unsaturated Hydrocarbon ambient. The p-SiCOH dielectric film has more —(CHx) and less Si—O—H and Si—H bonding moieties. Moreover, a stable pSiOCH dielectric film is provided in which the amount of Si—OH (silanol) and Si—H groups at least within the pores has been reduced by about 90% or less by the post treatment. A p-SiCOH dielectric film is produced that is flexible since the pores include stabilized crosslinking —(CH$_x$)— chains wherein x is 1, 2 or 3 therein. The dielectric film is produced utilizing an annealing step subsequent deposition that includes a gaseous ambient that includes at least one C—C double bond and/or at least one C—C triple bond.

9 Claims, 5 Drawing Sheets

(51) Int. Cl.
*C08J 7/18* (2006.01)
*H01L 23/532* (2006.01)
*C23C 16/40* (2006.01)
*C23C 16/505* (2006.01)
*C23C 16/56* (2006.01)
*H01L 21/02* (2006.01)
*H01L 21/316* (2006.01)
*C23C 16/511* (2006.01)
*H01L 21/768* (2006.01)

(52) U.S. Cl.
CPC .... *H01L21/02126* (2013.01); *H01L 21/02203* (2013.01); *H01L 21/02205* (2013.01); *H01L 21/02216* (2013.01); *H01L 21/02274* (2013.01); *H01L 21/02345* (2013.01); *H01L 21/02348* (2013.01); *H01L 21/02351* (2013.01); *H01L 21/31633* (2013.01); *H01L 21/31695* (2013.01); *H01L 23/53295* (2013.01); *C23C 16/511* (2013.01); *H01J 2237/336* (2013.01); *H01J 2237/338* (2013.01); *H01J 2237/3382* (2013.01); *H01L 21/76825* (2013.01); *H01L 21/76826* (2013.01); *H01L 21/76828* (2013.01)

(56) References Cited

U.S. PATENT DOCUMENTS

| | | | |
|---|---|---|---|
| 5,853,808 A * | 12/1998 | Arkles et al. | 427/377 |
| 6,114,032 A * | 9/2000 | Kelber | 428/336 |
| 6,147,009 A | 11/2000 | Grill et al. | |
| 6,312,793 B1 | 11/2001 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,576,980 B1 | 6/2003 | Shao et al. | |
| 6,630,243 B2 | 10/2003 | Valint et al. | |
| 6,881,447 B2 | 4/2005 | Lee et al. | |
| 6,936,551 B2 | 8/2005 | Moghadam et al. | |
| 7,049,247 B2 | 5/2006 | Gates et al. | |
| 7,098,149 B2 | 8/2006 | Lukas et al. | |
| 7,166,531 B1 | 1/2007 | van den Hoek et al. | |
| 7,253,105 B2 | 8/2007 | Dimitrakopoulos et al. | |
| 7,282,458 B2 | 10/2007 | Gates et al. | |
| 7,288,292 B2 | 10/2007 | Gates et al. | |
| 7,381,659 B2 * | 6/2008 | Nguyen et al. | 438/778 |
| 7,470,454 B2 | 12/2008 | Lukas et al. | |
| 7,479,306 B2 | 1/2009 | Edelstein et al. | |
| 7,491,658 B2 | 2/2009 | Nguyen et al. | |
| 7,521,377 B2 | 4/2009 | Gates et al. | |
| 7,851,232 B2 | 12/2010 | Van Schravendijk et al. | |
| 7,915,180 B2 | 3/2011 | Gates et al. | |
| 8,101,236 B2 * | 1/2012 | Edelstein et al. | 427/255.29 |
| 8,268,411 B2 * | 9/2012 | Gates et al. | 427/577 |
| 8,298,965 B2 | 10/2012 | McAndrew et al. | |
| 8,618,183 B2 * | 12/2013 | Gates et al. | 521/61 |
| 8,980,769 B1 * | 3/2015 | Haverkamp et al. | 438/795 |
| 2001/0002284 A1 | 5/2001 | Kohler et al. | |
| 2003/0064154 A1 * | 4/2003 | Laxman et al. | 427/255.28 |
| 2003/0224185 A1 | 12/2003 | Valint et al. | |
| 2004/0082193 A1 | 4/2004 | Rocha-Alvarez et al. | |
| 2004/0175957 A1 | 9/2004 | Lukas et al. | |
| 2004/0241463 A1 | 12/2004 | Vincent et al. | |
| 2005/0156285 A1 | 7/2005 | Gates et al. | |
| 2005/0194619 A1 | 9/2005 | Edelstein et al. | |
| 2005/0245096 A1 | 11/2005 | Gates et al. | |
| 2005/0276930 A1 * | 12/2005 | Gates et al. | 427/551 |
| 2006/0055004 A1 * | 3/2006 | Gates et al. | 257/632 |
| 2006/0078676 A1 | 4/2006 | Lukas et al. | |
| 2006/0079099 A1 * | 4/2006 | Nguyen et al. | 438/789 |
| 2006/0091559 A1 | 5/2006 | Nguyen et al. | |
| 2006/0165891 A1 | 7/2006 | Edelstein et al. | |
| 2006/0180900 A1 * | 8/2006 | Rantala et al. | 257/642 |
| 2006/0189133 A1 * | 8/2006 | Dimitrakopoulos et al. | 438/687 |
| 2006/0202311 A1 | 9/2006 | Nguyen et al. | |
| 2007/0054135 A1 | 3/2007 | Morita et al. | |
| 2007/0299239 A1 | 12/2007 | Weigel et al. | |
| 2012/0328796 A1 * | 12/2012 | Gates et al. | 427/551 |
| 2012/0329287 A1 | 12/2012 | Gates et al. | |
| 2014/0050860 A1 | 2/2014 | Gates et al. | |

OTHER PUBLICATIONS

Office Action dated Apr. 3, 2013 received in U.S. Appl. No. 11/846,250.

Office Action dated Apr. 16, 2014 received in U.S. Appl. No. 11/846,250.

Office Action dated Apr. 30, 2014 received in U.S. Appl. No. 11/842,182.

* cited by examiner

LOW K POROUS SICOH DIELECTRIC AND INTEGRATION WITH POST FILM FORMATION TREATMENT

CROSS REFERENCE TO RELATED APPLICATIONS

This application is a divisional of U.S. patent application Ser. No. 11/846,250, filed Aug. 28, 2007, the entire content and disclosure of which is incorporated herein by reference. This application is also related to U.S. Ser. No. 11/846,182, which cross referenced application was filed on the same date as the parent application, namely, U.S. patent application Ser. No. 11/846,250.

FIELD OF THE INVENTION

The present invention relates to a semiconductor dielectric film as well as a method of fabricating such a film. More particularly, the present invention relates to a porous dielectric material comprising atoms of at least Si, C, O and H (hereinafter p-SiCOH dielectric) which has a low dielectric constant (k of about 2.7 or less), enhanced post processing stability and improved film properties as compared with prior art p-SiCOH dielectrics. The present invention also relates to a method of fabricating such a p-SiCOH dielectric as well as the use of the same as a dielectric in various semiconductor structures, including, for example, interconnect structures.

BACKGROUND OF THE INVENTION

The continuous shrinking in dimensions of electronic devices utilized in ultra large scale integrated (ULSI) circuits in recent years has resulted in increasing the resistance of the interconnect metallization as well as increasing the capacitance of the intralayer and interlayer dielectric. This combined effect increases signal delays in ULSI electronic devices. In order to improve the switching performance of future ULSI circuits, low dielectric constant (k) insulators, and particularly those with a dielectric constant significantly lower than silicon oxide, are needed to reduce the capacitance.

Most of the fabrication steps of very large scale integration ("VLSI") and ULSI chips are carried out by plasma enhanced chemical or physical vapor deposition techniques. The ability to fabricate a low k dielectric by a plasma enhanced chemical vapor deposition (PECVD) technique using previously installed and available processing equipment simplifies its integration in the manufacturing process, reduces manufacturing cost, and creates less hazardous waste. U.S. Pat. Nos. 6,147,009 and 6,497,963 assigned to the common assignee of the present invention, which are incorporated herein by reference in their entirety, describe a low dielectric constant material consisting of elements of Si, C, O and H atoms having a dielectric constant not more than 3.6 and which exhibits very low crack propagation velocities. Such low k dielectrics are also referred to as C doped oxides or organosilicate glass (OSG).

U.S. Pat. Nos. 6,312,793, 6,441,491 and 6,479,110 B2, assigned to the common assignee of the present invention and incorporated herein by reference in their entirety, describe a multiphase low k dielectric material that consists of a matrix composed of elements of Si, C, O and H atoms, a phase composed mainly of C and H and having a dielectric constant of not more than 3.2.

U.S. Patent Application Publication Nos. 2005/0156285 A1 and 2005/0245096 A1, assigned to the common assignee of the present invention, and incorporated herein by reference in their entirety, describe means for improving the stability and/or physical properties such as tensile strength, elastic modulus, hardness cohesive strength and crack velocity in water of SiCOH dielectric materials.

U.S. Patent Application Publication Nos. 2005/0194619 A1 and 2006/0165891 A, assigned to the common assignee of the present invention and incorporated herein by reference in their entirety, provide a low dielectric material with increased cohesive strength that includes atoms of Si, C, O and H, in which a fraction of the C atoms are bonded as Si—$CH_3$ functional groups and another fraction of the C atoms are bonded as Si—R—Si, wherein R is phenyl, —$(CH_2)_n$— where n is greater than or equal to one, HC=CH, C=$CH_2$, C≡C or a $[S]_n$ linkage wherein n is as defined above.

For porous SiCOH ("p-SiCOH") dielectrics, post treatment in oxidizing ambients (including, for example, oxygen and water) increases the film's stress by increasing the formation of tetrahedral strain. The increased tetrahedral strain is caused by increased Si—O—Si bonding in the p-SiCOH dielectric film. The formation of Si—O—Si bonding is increased in such dielectric films by the presence of Si—OH and Si—H bonding in the as-deposited film or after performing a high-energy (including, for example, ultra-violet (UV), electron-beam (E-beam) and/or thermal) post deposition treatment step.

Thermodynamically, Si—OH and Si—H bonds in p-SiCOH films are readily oxidized by oxygen and water in an ambient to form Si—O—Si bonding due to a low activation energy needed for the formation of such Si—O—Si bonding. As p-SiCOH dielectrics become more porous with lower k values, the surface area and the absorption of oxygen/water increase significantly and become more susceptible to oxidation thus forming an increased number of strained Si—O—Si bonds to be present in the dielectric film. The formation of Si—O—Si bonds, in turn, increases the film's stress and crack velocity to levels which are not acceptable in semiconductor interconnect structures.

In view of the above, there is a need for providing a p-SiCOH dielectric film in which the film's stress and crack velocity are not significantly increased as compared to prior art p-SiCOH dielectrics. That is, a p-SiCOH dielectric film is needed in which the content of Si—O—Si bonding in the film is decreased by decreasing the content of Si—OH and Si—H bonding in the p-SiCOH dielectric film.

SUMMARY OF THE INVENTION

The present invention provides a porous SiCOH (p-SiCOH) dielectric film in which the stress change caused by increased tetrahedral strain is minimized. In other terms, the inventive porous SiCOH dielectric film has less Si—O—Si bonding as compared to prior art p-SiCOH dielectric films. Moreover, a stable p-SiOCH dielectric film is provided in which the amount of Si—OH (silanol) and/or Si—H groups at least within the pores has been reduced to about 0.01 atomic % or less. Hence, the inventive p-SiCOH dielectric film has hydrophobicity improvement as compared with prior art p-SiCOH dielectric films. In the present invention, a p-SiCOH dielectric film is produced that is flexible since the pores of the inventive film include stabilized crosslinking —$(CH_x)$— chains wherein x is 1, 2 or 3 therein.

In general terms, the inventive dielectric film comprises elements of Si, C, H and O, said dielectric film having a dielectric constant of about 2.7 or less, a random covalently bonded tri-dimensional network and a multiplicity of nano-sized pores, wherein said multiplicity of nano-sized pores include additional crosslinking —(CH$_x$)— chains, wherein x is 1, 2 or 3 that bond with at least one Si bond that originated from the reaction between a post treatment double bond precursor with some of the Si—OH groups and/or Si—H groups (i.e., Si bonding groups) normally present in said pores prior to the treatment.

The inventive dielectric film typically has a hydrocarbon content (saturated and unsaturated) within said pores and on a surface thereof that is from about 0.1 to about 10 wt. %, with a hydrocarbon content in the range from about 0.5 to about 2 wt. % being more typical.

The inventive dielectric film can be further characterized as having more branching C-group bonding —(CH$_x$)— chains, wherein x is 1, 2 or 3 on the surface and within the pores as compared with prior art p-SiCOH dielectric materials. The increased branching C-group bonding can be evidenced by additional hydrocarbon (on the order of about 1 atomic % C or higher) being presented in the film, as measured by Electron Spectroscopy for Chemical Analysis (ESCA), Rutherford Back Scattering (RBS), Time-of-Flight Secondary Ion Mass Spectroscopy (TOF SIMS), or FTIR as measured of carbon concentration or C—H bonding change before and after post-treatment.

In some embodiments of the present invention, the —(CH$_x$)— chains are also present on the surface of the film as well as within the pores. The presence of these chains on the surface of the dielectric film provides a film that is less sensitive to moisture as compared with prior art films not including the —(CH$_x$)— chains since the presence of the —(CH$_x$)— chains on the surface of the dielectric material removes the silanol groups (i.e., Si—OH) present on the surface of the dielectric film. Hence, the inventive p-SiCOH dielectric film is more hydrophobic than prior art SiCOH dielectric films.

The present invention also provides a method of forming such a p-SiCOH dielectric film. In particular, the applicants have determined that one can reduce or minimize the stress change and make the p-SiCOH dielectric film more stable and more hydrophobic by selecting an appropriate annealing ambient that has the ability to reduce oxidation of the dielectric film and thus minimize or reduce the formation of Si—OH (and to a lesser extent Si—H) groups on the surface of the dielectric film. In the present invention it has been determined that by annealing in an ambient that includes a gas that contains at least one C—C double bond, at least one C—C triple bond or a combination of at least one C—C double bond and at least one C—C triple bond produces the inventive p-SiCOH dielectric film. In particular, the bonding formation utilizing such an ambient gas produces flexible and stabilized crosslinking —(CH$_x$)— chains at least within the pores of the SiCOH dielectric film. Subsequently, the film stress will be reduced and the film's stability will be improved. The presence of the at least one C—C double bond and/or the at least one C—C triple bond in the annealing ambient also minimizes the impact of residual oxygen in the ambient during annealing and reduces/eliminates the formation of Si—OH and/or Si—H bonding on the surface of the dielectric film forming various bridging bonds.

In general terms, the inventive method comprises:

forming a dielectric film comprises elements of Si, C, H and O on a surface of a substrate, said dielectric film having a dielectric constant of about 2.7 or less, a random covalently bonded tri-dimensional network and a multiplicity of nano-sized pore;

annealing said dielectric film in the presence of a gaseous ambient that includes at least one C—C double bond, at least one C—C triple bond or a combination of at least one C—C double bond and at least one C—C triple bond, wherein said annealing forms crosslinking —(CH$_x$)— chains, wherein x is 1, 2 or 3, that react with at least some active bonding Si—OH groups and Si—H groups present in said pores.

That is, the —(CH$_x$)— chains bond with at least one Si group that is formed by reaction between an unsaturated hydrocarbon with Si—OH groups and Si—H groups originally present in said pores.

The annealing step may include a thermal anneal, an ultraviolet (UV) anneal, a plasma anneal and/or a microwave anneal.

In some embodiments, the pores contain the bonding Si—OH groups and/or the Si—H groups prior to the annealing step. In yet other embodiments, these bonding groups are generated during initial stages of said annealing process during pore formation and then they are removed during subsequent stages of the annealing process.

In some embodiments of the present invention, the gaseous ambient employed in the annealing step is an unsaturated hydrocarbon. In other embodiments of the present invention, the gaseous ambient is an organosilicon compound with fully hydrophobic bonds and with a low strained Si—O—Si bonding structure or with single vinyl double bond (C=C) groups. In yet another embodiment of the present invention, the gaseous ambient comprises a compound having an organosilicon group (R1, R2, R3)-Si—OH with silanol group bonding wherein R1, R2, R3 are identical or different and are a hydrocarbon, vinyl or diene radical.

In some embodiments of the present invention, the annealing in the aforementioned gaseous ambient occurs during a high-energy post deposition processing step that removes labile organic groups thus forming a porous dielectric material. In yet another embodiment of the present invention, the annealing in the above gaseous ambient may occur after a high energy post deposition processing step that removes the labile organic groups. In yet another embodiment of the present invention, the treating in the aforementioned ambient may occur during and after a high-energy post deposition processing step that removes the organic labile groups.

The annealing step of the present invention reduces both Si—OH and Si—H bond formation within the pores and on the surface of the p-SiCOH film, increases the film's hydrophobicity, enhances the films stability and reduces the film's stress by reducing the formation of Si—O—Si crosslinking bonds.

The present invention also relates to electronic structures, in which the p-SiCOH dielectric film of the present invention may be used as an interconnect (i.e., interlevel or intralevel) dielectric, a capping layer, and/or as a hard mask/polish-stop layer.

Specifically, the electronic structures of the present invention include a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material. In the above structure, each of the insulating layers can comprise the inventive p-SiCOH dielectric film which has a reduced content of Si—O—Si bonding.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

In some embodiments, the dielectric cap itself can comprise the inventive p-SiCOH dielectric film.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive p-SiCOH dielectric film as well.

The present invention also relates to the use of the inventive SiCOH dielectric film in other electronic structures including a structure including at least two conductors and an optoelectronic sensing structure, for use in detection of light.

DETAILED DESCRIPTION OF THE INVENTION

The present invention, which describes a p-SiCOH dielectric film having a reduced content of Si—OH and Si—H bondings, and increased —($CH_x$)— bondings within the pores and on the surface of the film, a method of fabricating the same and electronic structures containing the inventive p-SiCOH dielectric film, will now be described in greater detail.

Figure 1A:
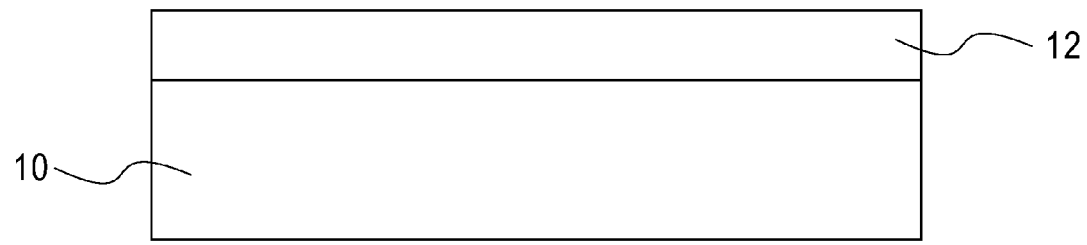
FIGS. 1A-1C are pictorial representations (through cross sectional views) depicting the basic processing steps in which a p-SiCOH dielectric film having reduced Si—OH content and thus reduced Si—O—Si bonding is formed on a surface of a substrate.

In accordance with the method of the present invention, a SiCOH dielectric film 12 is formed on a surface of a substrate 10 such as shown, for example, in FIG. 1A. The term "substrate" when used in conjunction with substrate 10 includes, a semiconducting material, an insulating material, a conductive material or any combination thereof, including multilayered structures. Thus, for example, substrate 10 may be a semiconducting material such as Si, SiGe, SiGeC, SiC, GaAs, InAs, InP and other III/V or II/VI compound semiconductors. The semiconductor substrate 10 may also include a layered substrate such as, for example, Si/SiGe, Si/SiC, silicon-on-insulators (SOIs) or silicon germanium-on-insulators (SGOIs). When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material. An example of a substrate that includes a combination of the above is an interconnect structure.

The SiCOH dielectric film 12 is typically deposited using plasma enhanced chemical vapor deposition (PECVD). In addition to PECVD, the present invention also contemplates that the SiCOH dielectric film 12 can be formed utilizing chemical vapor deposition (CVD), high-density plasma (HDP) deposition, pulsed PECVD, spin-on application, or other related methods. The thickness of the SiCOH dielectric film 12 deposited may vary; typical ranges for the deposited SiCOH dielectric film 12 are from about 50 nm to about 1 μm, with a thickness from 100 to about 500 nm being more typical.

Typically, the SiCOH dielectric film is deposited using the processing techniques disclosed in co-assigned U.S. Pat. Nos. 6,147,009, 6,312,793, 6,441,491, 6,437,443, 6,541,398, 6,479,110 B2, and 6,497,963 as well as in U.S. Patent Application Publication Nos. 2005/0156285 A1, 2005/0245096 A1, 2005/0194619 A1 and 2006/0165891 A1, the contents of each of which are incorporated herein by reference.

Specifically, the SiCOH dielectric film 12 is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof, thereby stabilizing the reactants in the reactor and improving the uniformity of the SiCOH dielectric film 12 deposited on the substrate 10.

In addition to the first precursor, a second precursor (gas, liquid or vapor) comprising atoms of C, H, and optionally O, F and N can be used. Optionally, a third precursor (gas, liquid or gas) comprising Ge may also be used.

The first precursor is selected from silane ($SiH_4$) derivatives having the molecular formula SiRR'R"R'" where R, R', R″, and R‴ may or may not be identical and are selected from H, alkyl, and alkoxy, preferably methyl, ethyl, methoxy, and ethoxy. Preferred precursors include: diethoxydimethylsilane, diethoxymethylsilane (DEMS), ethoxyltrimethylsilane, ethoxydimethylsilane, dimethoxydimethylsilane, dimethoxymethylsilane, triethoxysilane, and trimethoxymethylsilane. In some embodiments, the first precursor is selected from organosilicon molecules with ring structures comprising SiCOH components such as 1,3,5,7-tetramethyl-cyclotetrasiloxane ("TMCTS" or "$C_4H_{16}O_4Si_4$"), and octamethylcyclotetrasiloxane (OMCTS).

The second precursor employed in the present application is an organic compound that is selected from:

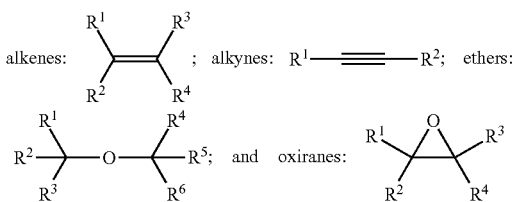

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents. Additionally, other atoms such as S, Si, or other halogens may be contained in the second precursor molecule. Of these species, the most suitable are ethylene oxide, propylene oxide, cyclopentene oxide, isobutylene oxide, 2,2,3-trimethyloxirane, butadienemonoxide, bicycloheptadiene (BCHD), 1,2-epoxy-5-hexene, 2-methyl-2-vinyloxirane, 1-isopropyl-cyclohexa-1,3-diene and tertbutylmethylether.

In some embodiments, the second precursor may be selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds).

It is noted that the above second precursors include labile functional groups that can be readily removed from the dielectric film during a subsequent processing (i.e., curing) step. In some embodiments, a separate porogen material can be added during the formation of the p-SiCOH dielectric film.

The third precursor which can optionally be used is formed from germane hydride or any other reactant comprising a source of Ge.

The SiCOH film 12 may be deposited using a method the includes the step of providing a parallel plate reactor, which has a conductive area of a substrate chuck between about 85 $cm^2$ and about 1600 $cm^2$, and a gap between the substrate and a top electrode between about 1 cm and about 12 cm. A high frequency RF power is applied to one of the electrodes at a frequency from about 0.45 MHz to about 200 MHz. Optionally, an additional low frequency power can be applied to one of the electrodes.

The conditions used for the deposition step may vary depending on the desired final dielectric constant of the SiCOH dielectric film 12. Broadly, the conditions used for providing a stable dielectric material comprising elements of Si, C, O, H that has a dielectric constant of about 2.7 or less include: setting the substrate temperature at a temperature from about 200° C. to about 425° C.; setting the high frequency RF power density within a range from about 0.1 W/$cm^2$ to about 1.5 W/$cm^2$; setting the first liquid precursor flow rate within a range from about 100 mg/min to about 5000 mg/min, optionally setting the second liquid precursor flow rate within a range from about 50 mg/min to about 10,000 mg/min; optionally setting the third liquid precursor flow rate within a range from about 25 mg/min to about 4000 mg/min; optionally setting the inert carrier gases such as helium (or/and argon) flow rate within a range from about 50 sccm to about 5000 sccm; setting the reactor pressure at a pressure within a range from about 1000 mTorr to about 7000 mTorr; and setting the high frequency RF power within a range from about 75 W to about 1000 W. Optionally, an ultra low frequency power may be added to the plasma within a range from about 30 W to about 400 W. When the conductive area of the substrate chuck is changed by a factor of X, the RF power applied to the substrate chuck may also change by a factor of X.

When an oxidizing agent is employed in the present invention, it is flown into the PECVD reactor at a flow rate within a range from about 10 sccm to about 1000 sccm.

While liquid precursors are used in the above example, it is known in the art that the organosilicon gas phase precursors (such as trimethylsilane) can also be used for the deposition.

The dielectric film 12 formed at this point of the present invention contains a matrix of a hydrogenated oxidized silicon carbon material (SiCOH) comprising atoms of Si, C, O and H in a covalently bonded tri-dimensional network and having a dielectric constant of not more than about 3.6 prior to curing. After UV or E-beam curing, the film will have some pores and the dielectric constant of the film is about 2.7 or less. The tri-dimensional network may include a covalently bonded tri-dimensional structure comprising Si—O, Si—C, Si—H, C—H and C—C bonds. The dielectric film 12 may comprise F and N and may optionally have the Si atoms partially substituted by Ge atoms.

Figure 1B:
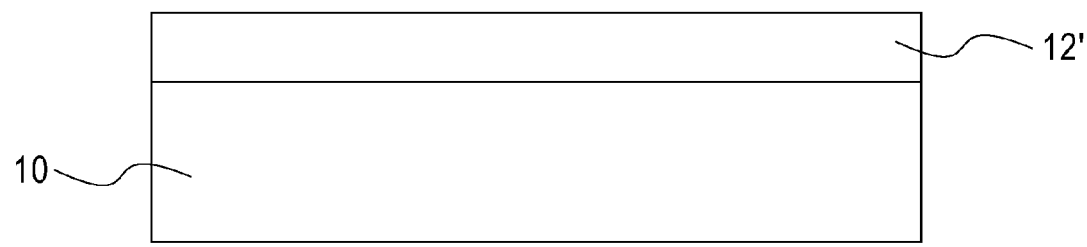

After deposition of the SiCOH dielectric film, the deposited film is subjected to a high energy post deposition processing step that forms a porous SiCOH dielectric film 12' (See FIG. 1B). Specifically, the as deposited film can be processed using a high energy source to stabilize the film, remove labile functional groups and improve its properties (electrical, mechanical, adhesive). Suitable energy sources that can be used for the post processing step include thermal, chemical, ultraviolet (UV) light, electron beam (E-beam), microwave, and plasma. Combinations of the aforementioned energy sources can also be used in the present invention.

The thermal energy source includes any source such as, for example, a heating element or a lamp, that can heat the deposited dielectric material to a temperature from about 300° to about 500° C. More preferably, the thermal energy source is capable of heating the deposited dielectric material to a temperature from about 350° to about 430° C. This thermal treatment process can be carried out for various time periods, with a time period from about 1 minute to about 300 minutes being typical. The thermal treatment step is typically performed in the presence of an inert gas such as He and Ar. The thermal treatment step may include a rapid thermal anneal, a furnace anneal, a laser anneal or a spike anneal.

The UV light treatment step is performed utilizing a source that can generate light having a wavelength from about 500 to about 150 nm, to irradiate the substrate while the wafer temperature is maintained at a temperature from about 25° to about 500° C., with temperatures from about 300° to about 450° C. being preferred. Radiation with less than 370 nm is of insufficient energy to dissociate or activate important bonds, so the wavelength range 150-370 nm is a preferred range. Using literature data and absorbance spectra measured on as deposited films, the inventors have found that less than 170 nm radiation may not be favored due to degradation of the SiCOH film. Further, the energy range 310-370 nm is less useful than the range 150-310 nm, due to the relatively low energy per photon from 310-370 nm. Within the 150-310 nm range, optimum overlap with the absorbance spectrum of the as deposited film and minimum degradation of the film properties (such as hydrophobicity) may be optionally used to select a most effective region of the UV spectrum for changing the SiCOH properties.

The electron beam treatment step is performed utilizing a source that is capable of generating a uniform electron flux over the wafer, with energies from about 0.5 to about 25 keV and current densities from about 0.1 to about 100 microAmp/$cm^2$ (preferably about 1 to about 5 microAmp/$cm^2$), while the wafer temperature is maintained at a temperature from about 25° to about 500° C., with temperatures from about 300° to about 450° C. being preferred. The preferred dose of electrons used in the electron beam treatment step is from about 50 to about 500 microcoulombs/$cm^2$, with about 100 to about 300 microcoulombs/$cm^2$ being most preferred.

The SiCOH dielectric film 12 after curing comprises between about 5 and about 40 atomic percent of Si; between about 5 and about 45 atomic percent of C; between 0 and about 60 atomic percent of O; and between about 10 and about 55 atomic percent of H. The SiCOH dielectric film 12 is thermally stable above 350° C. After post-deposition curing, the SiCOH film 12 preferably has a thickness of not more than 1.3 micrometers and a crack propagation velocity in water of less than $10^{-9}$ meters per second.

Subsequently, the inventive second post treatment including either plasma, thermal, UV or E-beam in an ambient that includes a gas that contains at least one C—C double bond, at least one C—C triple bond or a combination of at least one C—C double bond and at least one C—C triple bond is used. For example, thermal treatment including annealing at a temperature range from about 300° to about 450° C. for a duration from about 1 to about 120 minutes in an ambient gas that includes one of ethylene ($C_2H_4$), acetylene ($C_2H_2$), propylene ($C_3H_6$), and butene ($C_4H_8$) as well as an organic gas compound that is selected from one of the following formula:

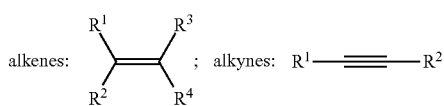

with $R^1$, $R^2$, $R^3$, $R^4$ are either saturated hydrocarbon groups (—$CH_3$, —$C_2H_5$, and etc.), or hydrogen can be used in the present invention.

The plasma treatment step which includes the above mentioned hydrocarbon gas including at least one C—C double bond and/or at least one C—C triple bond is performed utilizing a source that is capable of generating atomic hydrogen (H), and optionally $CH_3$ or other hydrocarbon radicals. Downstream plasma sources are preferred over direct plasma exposure. During plasma treatment the wafer temperature is maintained at a temperature from about 25° to about 500° C., with temperatures from about 300° to about 450° C. being preferred.

The plasma treatment step is performed by introducing a gas into a reactor that can generate a plasma and thereafter it is converted into a plasma. The gas that can be used for the plasma treatment includes at least one of the above mentioned hydrocarbons containing at least one C—C double bond and/or at least one C—C triple bond and an inert gas such as Ar, N, He, Xe or Kr, with He being preferred; hydrogen or related sources of atomic hydrogen, methane, methylsilane, related sources of $CH_3$ groups, and mixtures thereof. The flow rate of the plasma treatment gas may vary depending on the reactor system being used. The chamber pressure can range anywhere from about 0.05 to about 20 torr, but the preferred range of pressure operation is from about 1 to about 10 torr. The plasma treatment step occurs for a period of time, which is typically from about ½ to about 10 minutes, although longer times may be used within the invention.

An RF or microwave power source is typically used to generate the above plasma. The RF power source may operate at either the high frequency range (on the order of about 100 W or greater); the low frequency range (less than about 250 W) or a combination thereof may be employed. The high frequency power density can range anywhere from about 0.1 to about 2.0 $W/cm^2$ but the preferred range of operation is from about 0.2 to about 1.0 $W/cm^2$. The low frequency power density can range anywhere from about 0.1 to about 1.0 $W/cm^2$ but the preferred range of operation is from about 0.2 to about 0.5 $W/cm^2$. The chosen power levels must be low enough to avoid significant sputter etching of the exposed dielectric surface (less than 5 nanometers removal).

For UV and E-beam treatment processes, it is possible to use the same hydrocarbon ambient (double and triple bond hydrocarbon gases) and temperature (about 200° to about 450° C. range) as used in the thermal process. With UV and E-beam treatment, it is also possible to combine the first and second inventive post deposition processes into a single two-step post treatment process which includes 1) a first step post-treatment in inert ambient (Ar, He) to remove porogen and form pores, and 2) a second step post-treatment in the inventive double/triple bond hydrocarbon gases to removal any remain Si—H and Si—OH and to form cross-linking —($CH_x$)— bonding in the pores and film's surface The above high energy first and second inventive post deposition processes provide a p-SiCOH dielectric film 12' on the surface of substrate 10. The p-SiCOH dielectric film 12' has a multiplicity of nano-sized pores therein. The nano-sized pores include at least one of Si—OH groups and Si—H groups therein. The nano-sized pores have a pore size from about 0.3 to about 10 nm, with a pore size from about 0.8 to about 2 nm being more preferred.

Figure 1C:
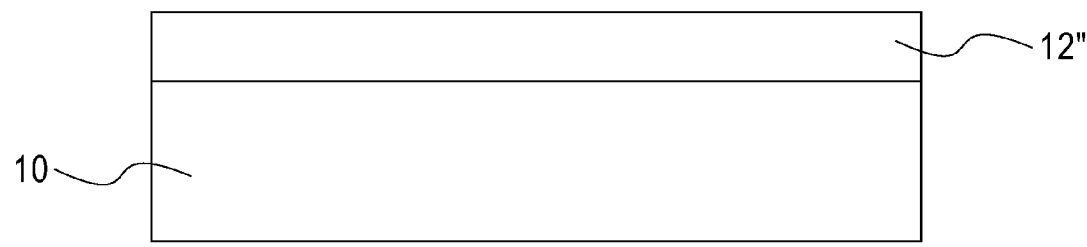

The second post treatment step, which is a separate step of treating the p-SiCOH dielectric film in a gaseous ambient that includes at least one C—C double bond, at least one C—C triple bond or a combination of at least one C—C double bond and at least one C—C triple bond, is employed after the high energy post deposition step. In yet other embodiments of the present invention, treating in the aforementioned gaseous ambient occurs during the high energy post deposition step that removes labile organic groups that forms a porous dielectric material. In yet another embodiment of the present invention, the treating in the aforementioned ambient may occur during and after the high energy post deposition treatment step that removes the organic labile groups. FIG. 1C illustrates a treated p-SiCOH dielectric film 12" of the present invention.

It is noted that the treating in the aforementioned ambient forms crosslinking —(CH$_x$)— chains, wherein x is 1, 2, or 3 that bond with at least one Si-bonds, which originally came from Si—OH groups and Si—H groups also present in said pores before the post treatment. Hence, the amount of Si—O—H and Si—H bonds within the pores of the dielectric film are reduced due to the reaction between the double and/or triple hydrocarbon gases with the Si—OH and Si—H in the pore. A typical reduction of about 5% or greater of Si—OH and Si—H bonds originally from the untreated film that can be achieved in the present invention. In some embodiments, the amount of Si—O—H and Si—H bonds on the surface of the dielectric film are also reduced and making the film hydrophobic.

The second annealing step may include a thermal anneal, an ultraviolet (UV) anneal, a plasma anneal and/or a microwave anneal. The conditions for each of the anneals is the same as mentioned above, expect that a gaseous ambient including at least one C—C— double and/or triple bond is employed.

In some embodiments of the present invention, the anneal ambient is an unsaturated hydrocarbon. In this embodiment, the unsaturated hydrocarbon contains from about 2 to about 24, preferably 2 to 5, carbon atoms. The carbon atoms may be straight chained or branched. Examples of suitable unsaturated hydrocarbons that can be employed in the present invention include, but are not limited to ethylene, propylene, butylene, ethane, butane, and acetylene.

In other embodiment of the present invention, the annealing ambient is an organosilicon compound with fully hydrophobic bonds and with a low strained Si—O—Si bonding structure or with single vinyl double bond (C═C) groups. Examples of suitable organosilicon compounds with fully hydrophobic bonds and with a low strained Si—O—Si bonding structure or with single vinyl double bond (C═C) groups that can be employed in the present invention include, but are not limited to tetramethyl divinyl disiloxane, dimethyl tetravinyl disiloxane, hexamethyl disiloxane, hexavinyl disiloxane, and hexamethyl disilazane (HMDS).

In yet another embodiment of the present invention, the annealing ambient comprises a compound having an organosilicon group (R)$_3$—Si—OH with one silanol group bonding wherein R is the same or different and is a saturated hydrocarbon, or vinyl or diene group. Examples of such organosilanes include, but are not limited to divinyl methyl silanol, and diethyl vinyl silanol.

Of the various gaseous ambients mentioned above, it is preferred to use an unsaturated hydrocarbon ambient, with butene, propylene, ethylene and acetylene being highly preferred examples of such unsaturated hydrocarbon ambients.

The above ambients may be used alone or mixed together or used in the presence of another gas including an inert gas such as Ar, and/or He.

The amount of gaseous ambient including at least one C—C double/triple bond present during the annealing ambient may vary depending on the type of annealing process used, as well as the surface area of the p-SiCOH dielectric being annealed. The annealing ambient pressure typically ranges from about 1 torr to about 760 torr, and the preferred range is from about 5 to about 100 torr. The flow rates of the hydrocarbon gases range from about 10 to about 1000 sccm for the ambient employed.

The annealing step of the present invention reduces both Si—OH and Si—H bond formation within the pores and on the surface of the p-SiCOH film, increases the film's hydrophobicity, enhances the films stability and reduces the film's stress by crosslinking Si—R—Si bonding formation.

Electronic devices which can contain the inventive p-SiCOH dielectric film are shown in FIGS. 2-7B. It should be noted that the devices shown in FIGS. 2-7B are merely illustrative examples of the present invention, while an infinite number of other devices may also be formed by the present invention novel methods.

Figure 2:
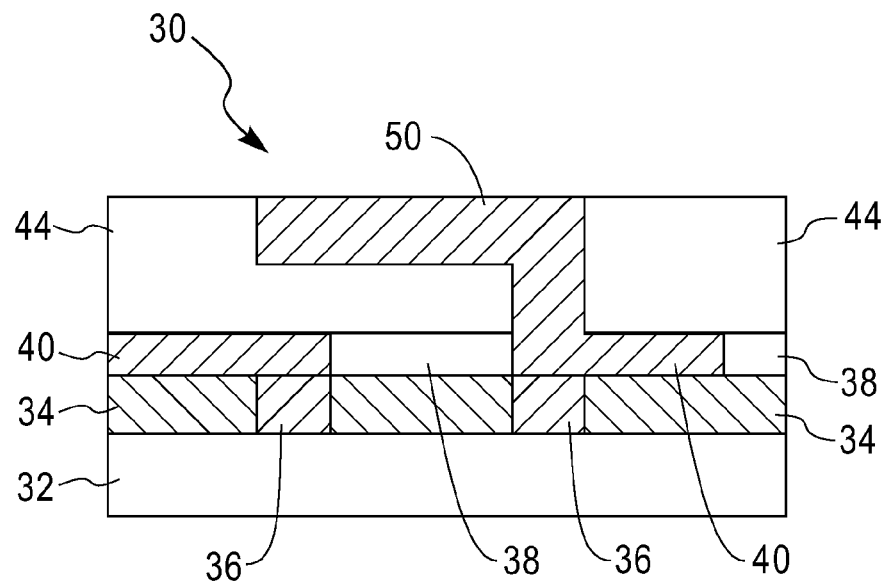
FIG. 2 is an enlarged, cross-sectional view of an electronic device of the present invention that includes the inventive p-SiCOH dielectric film as both the intralevel dielectric layer and the interlevel dielectric layer.

In FIG. 2, an electronic device 30 built on a silicon substrate 32 is shown. On top of the silicon substrate 32, an insulating material layer 34 is first formed with a first region of metal 36 embedded therein. After a CMP process is conducted on the first region of metal 36, a p-SiCOH dielectric film 38 of the present invention is formed on top of the first layer of insulating material 34 and the first region of metal 36. The first layer of insulating material 34 may be suitably formed of silicon oxide, silicon nitride, doped varieties of these materials, or any other suitable insulating materials. The p-SiCOH dielectric film 38 is then patterned in a photolithography process followed by etching and a conductor layer 40 is deposited thereon. After a CMP process on the first conductor layer 40 is carried out, a second layer of the inventive p-SiCOH film 44 is formed by a overlying the first p-SiCOH dielectric film 38 and the first conductor layer 40. The conductor layer 40 may be a deposit of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the p-SiCOH dielectric film 44 is conducted followed by etching and then a deposition process for the second conductor material. The second region of conductor 50 may also be a deposit of either a metallic material or a nonmetallic material, similar to that used in depositing the first conductor layer 40. The second region of conductor 50 is in electrical communication with the first region of conductor 40 and is embedded in the second layer of the SiCOH dielectric film 44. The second layer of the p-SiCOH dielectric film 44 is in intimate contact with the first layer of p-SiCOH dielectric material 38. In this example, the first layer of the p-SiCOH dielectric film 38 is an intralevel dielectric material, while the second layer of the p-SiCOH dielectric film 44 is both an intralevel and an interlevel dielectric. Based on the low dielectric constant of the inventive p-SiCOH dielectric films, superior insulating property can be achieved by the first insulating layer 38 and the second insulating layer 44.

Figure 3:
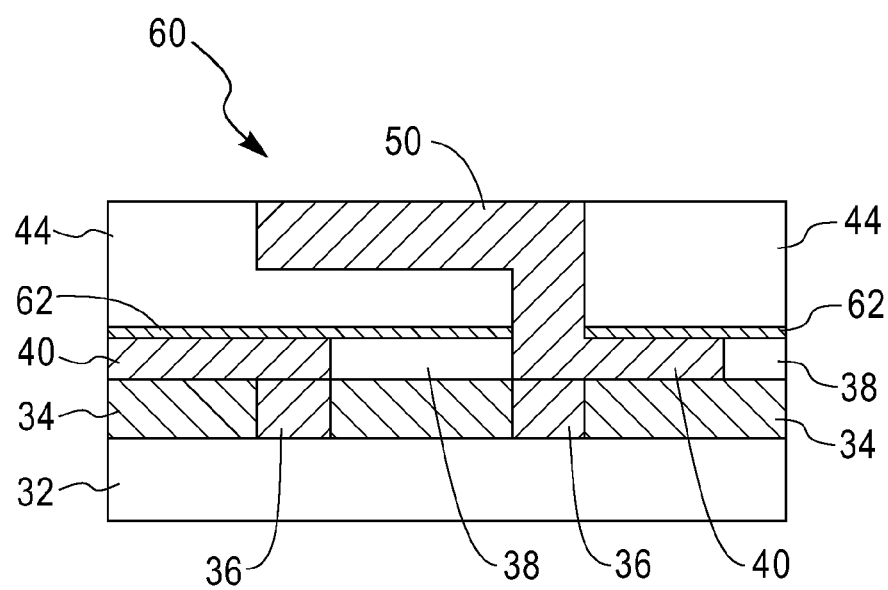
FIG. 3 is an enlarged, cross-sectional view of the electronic structure of FIG. 2 having an additional diffusion barrier dielectric cap layer deposited on top of the inventive p-SiCOH dielectric film.

FIG. 3 shows a present invention electronic device 60 similar to that of electronic device 30 shown in FIG. 2, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, silicon carbide, silicon carbo-nitride (SiCN), silicon carbo-oxide (SiCO), Silicon Carbo-oxynitride (SiCON) and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 4:
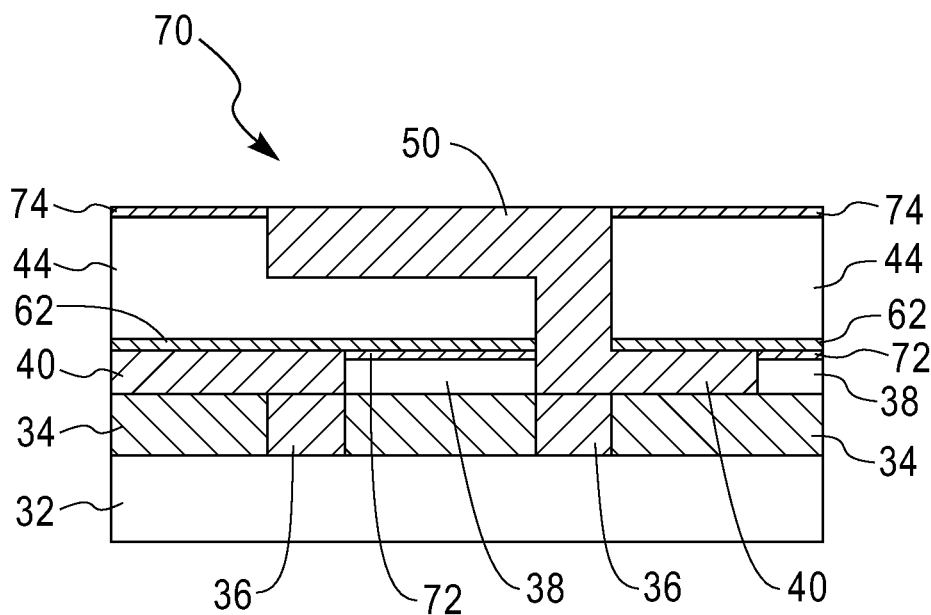
FIG. 4 is an enlarged, cross-sectional view of the electronic structure of FIG. 3 having an additional RIE hard mask/polish-stop dielectric cap layer and a dielectric cap diffusion barrier layer deposited on top of the polish-stop layer.

Another alternate embodiment of the present invention electronic device 70 is shown in FIG. 4. In the electronic device 70, two additional dielectric cap layers 72 and 74 which act as a RIE mask and CMP (chemical mechanical polishing) polish stop layer are used. The first dielectric cap layer 72 is deposited on top of the first low k insulating material layer 38 and used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be deposited of a suitable dielectric material such as silicon oxide, silicon nitride, silicon oxynitride, silicon carbide, silicon carbo-oxide (SiCO), Silicon Carbo-oxynitride (SiCON) and their hydrogenated compounds. A preferred polish stop layer composition is SiCH or SiCOH for layers 72 or 74. The SiCOH layer may include the inventive p-SiCOH dielectric film. A second dielectric layer can be added on top of the second p-SiCOH dielectric film 44 for the same purposes.

Figure 5:
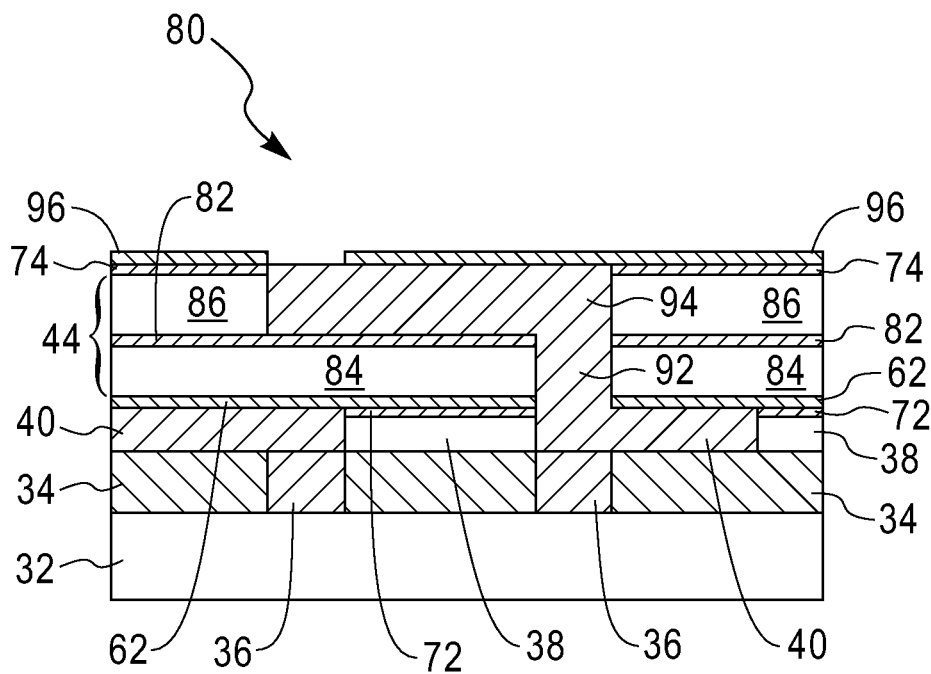
FIG. 5 is an enlarged, cross-sectional view of the electronic structure of FIG. 4 having additional RIE hard mask/polish-stop dielectric layers deposited on top of the p-SiCOH dielectric film of the present invention.

Still another alternate embodiment of the present invention electronic device 80 is shown in FIG. 5. In this alternate embodiment, an additional layer 82 of dielectric material is deposited and thus dividing the second insulating material layer 44 into two separate layers 84 and 86. The intralevel and interlevel dielectric layer 44 formed of the inventive p-SiCOH material is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes atoms of Si, C, O and H, or preferably a p-SiCOH dielectric film of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the dielectric film of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the p-SiCOH dielectric film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the p-SiCOH dielectric film of the present invention.

Still other alternate embodiments of the present invention includes an electronic structure that has layers of insulating material as intralevel or interlevel dielectrics in a wiring structure similar to that described immediately above but further includes a dielectric cap layer which is formed of the p-SiCOH dielectric material of the present invention situated between an interlevel dielectric layer and an intralevel dielectric layer.

Figure 6:
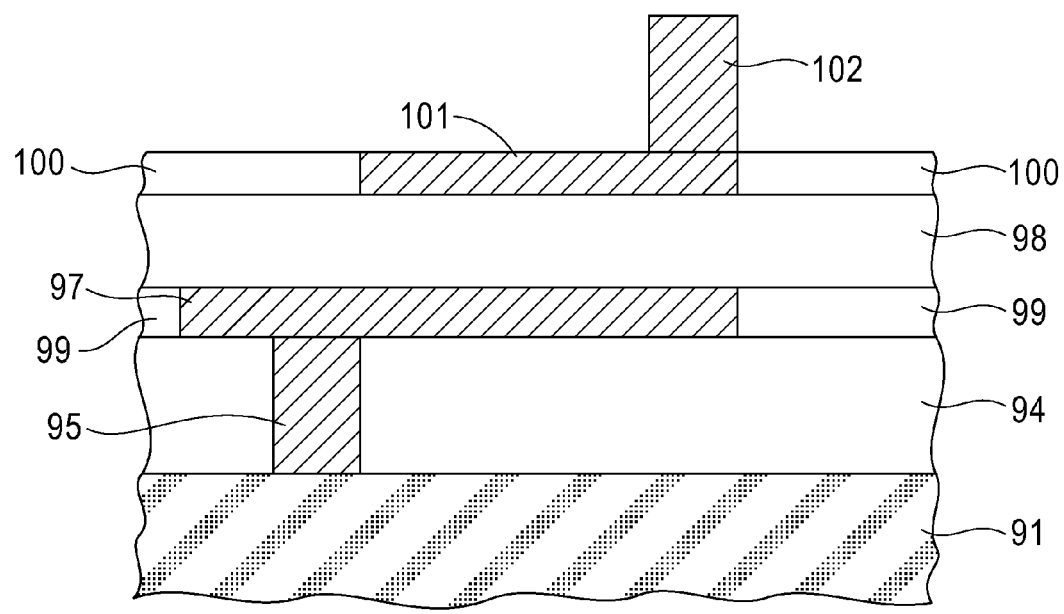
FIG. 6 is a pictorial representation (through a cross sectional view) illustrating an electronic structure including at least two conductors and the inventive p-SiCOH dielectric material.

In some embodiments as shown, for example in FIG. 6, an electronic structure containing at least two metallic conductor elements (labeled as reference numerals 97 and 101) and a p-SiCOH dielectric material (labeled as reference numeral 98). Optionally, metal contacts 95 and 102 are used to make electrical contact to conductors 97 and 101. The inventive p-SiCOH dielectric 98 provides electrical isolation and low capacitance between the two conductors. The electronic structure is made using a conventional technique that is well known to those skilled in the art such as described, for example, in U.S. Pat. No. 6,737,727, the entire content of which is incorporated herein by reference.

The at least two metal conductor elements are patterned in a shape required for a function of a passive or active circuit element including, for example, an inductor, a resistor, a capacitor, or a resonator.

Figure 7A:
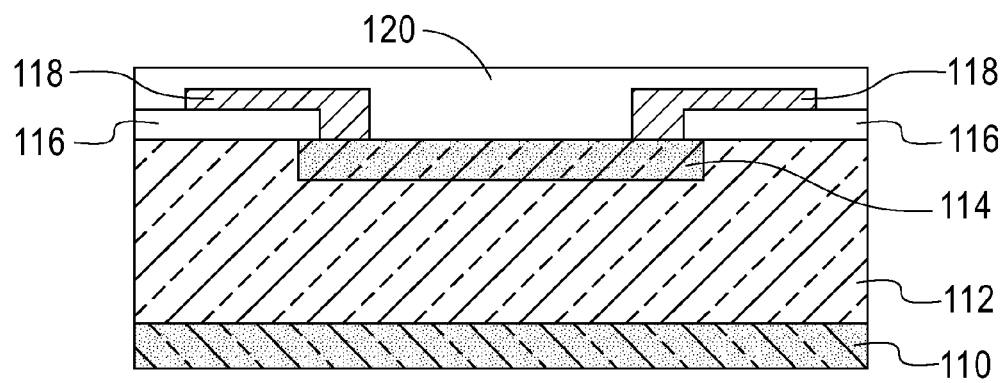
FIGS. 7A-7B are pictorial representations (through cross sectional views) illustrating electronic structures including a sensing element and the inventive p-SiCOH dielectric material.
Figure 7B:
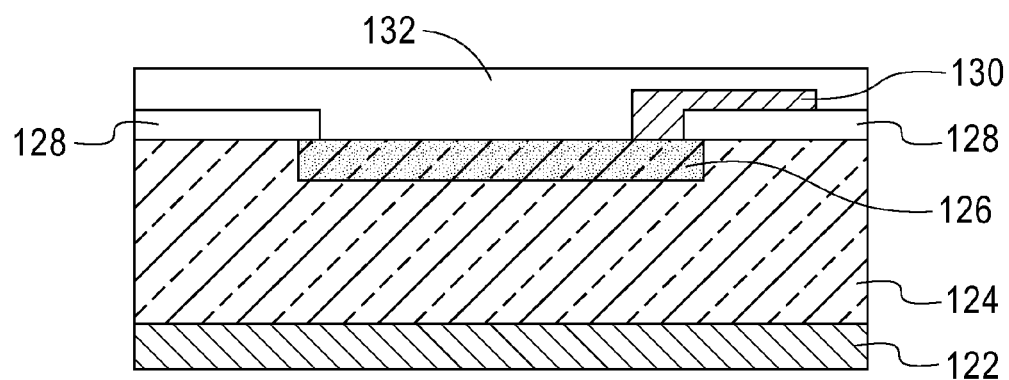

Additionally, the inventive p-SiCOH dielectric can be used in an electronic sensing structure wherein the optoelectronic sensing element (detector) shown in FIG. 7A or 7B is surrounded by a layer of the inventive SiCOH dielectric material. The electronic structure is made using a conventional technique that is well known to those skilled in the art. Referring to FIG. 7A, a p-i-n diode structure is shown which can be a high speed Si based photodetector for IR signals. The n+ substrate is 110, and atop this is an intrinsic semiconductor region 112, and within region 112 p+ regions 114 are formed, completing the p-i-n layer sequence. Layer 116 is a dielectric (such as $SiO_2$) used to isolate the metal contacts 118 from the substrate. Contacts 118 provide electrical connection to the p+ regions. The entire structure is covered by the inventive SiCOH dielectric material, 120. This material is transparent in the IR region, and serves as a passivation layer.

A second optical sensing structure is shown in FIG. 7B, this is a simple p-n junction photodiode, which can be a high speed IR light detector. Referring to FIG. 7B, the metal contact to substrate is 122, and atop this is an n-type semiconductor region 124, and within this region p+ regions 126 are formed, completing the p-n junction structure. Layer 128 is a dielectric (such as $SiO_2$) used to isolate the metal contacts 130 from the substrate. Contacts 130 provide electrical connection to the p+ regions. The entire structure is covered by the inventive p-SiCOH dielectric material, 132. This material is transparent in the IR region, and serves as a passivation layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a porous dielectric film comprising:
    forming a dielectric film comprising elements of Si, C, H and O on a surface of a substrate, said dielectric film having a dielectric constant of about 2.7 or less, a random covalently bonded tri-dimensional network and a multiplicity of nano-sized pores having a pore size from about 0.3 nm to 10 nm, wherein Si—OH groups are present within the pores of said dielectric film; and
    annealing said dielectric film in a Si-containing gaseous ambient selected from the group consisting of tetramethyl divinyl disiloxane, dimethyl tetravinyl disiloxane, hexavinyl disiloxane, divinyl methyl silanol, and diethyl vinyl silanol, wherein said annealing forms crosslinking —$(CH_x)$— chains within the pores that bond with at least one Si originally present in at least one of said Si—OH groups, wherein x is 1,2 or 3, provides a hydrocarbon content within said pores and on said surface of from about 0.1 to 10 wt. %.

2. The method of claim 1 wherein said forming said dielectric film comprises a deposition step and a post-deposition processing step that removes labile functional groups from an initial film deposited by said deposition step.

3. The method of claim 2 wherein said annealing occurs during said post-deposition processing step, after said post-deposition processing step, or during and after said post-deposition processing step.

4. The method of claim 1 wherein said annealing includes a thermal anneal, an ultraviolet (UV) anneal, a plasma anneal, a microwave anneal or any combination thereof.

5. The method of claim 2 wherein said deposition step includes a plasma enhanced chemical vapor deposition process.

6. A method of forming a porous dielectric material comprising:
    forming a dielectric film comprising elements of Si, C, H and O on a surface of a substrate, said dielectric film having a dielectric constant of about 2.7 or less and a random covalently bonded tri-dimensional network;
    treating said dielectric film to form a multiplicity of nano-sized pores having a pore size from about 0.3 nm to 10 nm therein, wherein Si—OH groups are present within said pores of said dielectric film; and
    annealing said treated dielectric film in a Si-containing gaseous ambient selected from the group consisting of tetramethyl divinyl disiloxane, dimethyl tetravinyl disiloxane, hexavinyl disiloxane, divinyl methyl silanol, and diethyl vinyl silanol, group, wherein said annealing forms crosslinking —$(CH_x)$— chains within the pores that bond with at least one Si originally present in at least one of said Si—OH groups, wherein x is 1,2 or 3, and provides a hydrocarbon content within said pores and on said surface of from about 0.1 to 10 wt. %.

7. The method of claim 6 wherein said annealing includes a thermal anneal, an ultraviolet (UV) anneal, a plasma anneal, a microwave anneal or any combination thereof.

8. A method of forming a porous dielectric material comprising:
    forming a dielectric film comprising elements of Si, C, H and O on a surface of a substrate, said dielectric film having a dielectric constant of about 2.7 or less and a random covalently bonded tri-dimensional network;
    treating said dielectric film to form a multiplicity of nano-sized pores having a pore size from about 0.3 nm to 10 nm therein, wherein Si—OH groups are present in said pores of said dielectric film, wherein during said treating an annealing step is performed in a Si-containing gaseous ambient selected from the group consisting of tetramethyl divinyl disiloxane, dimethyl tetravinyl disiloxane, hexavinyl disiloxane, divinyl methyl silanol, and diethyl vinyl silanol, wherein said annealing forms crosslinking —$(CH_x)$— chains with in the pores that bond with at least one Si originally present in at least one of said Si—OH groups, wherein x is 1, 2 or 3, and provides a hydrocarbon content within said pores and on said surface of from about 0.1 to 10 wt. %.

9. The method of claim 8 wherein said annealing includes a thermal anneal, an ultraviolet (UV) anneal, a plasma anneal, a microwave anneal or any combination thereof.

* * * * *